US007608523B2

(12) United States Patent
Sekiya (10) Patent No.: US 7,608,523 B2
(45) Date of Patent: Oct. 27, 2009

(54) WAFER PROCESSING METHOD AND ADHESIVE TAPE USED IN THE WAFER PROCESSING METHOD

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 160 days.

(21) Appl. No.: 11/505,895

(22) Filed: Aug. 18, 2006

(65) Prior Publication Data
US 2007/0045799 A1    Mar. 1, 2007

(30) Foreign Application Priority Data
Aug. 26, 2005  (JP) ............................. 2005-246054
Aug. 26, 2005  (JP) ............................. 2005-246521

(51) Int. Cl.
*H01L 21/00* (2006.01)
(52) U.S. Cl. ................ 438/464; 438/462; 257/E21.599
(58) Field of Classification Search ................... 348/87; 257/686, E21.599; 156/154; 438/462, 464
See application file for complete search history.

(56) References Cited

U.S. PATENT DOCUMENTS

| 6,388,703 | B1 * | 5/2002 | Negishi | ........................ 348/87 |
| 6,762,488 | B2 * | 7/2004 | Maeda et al. | ................ 257/686 |
| 6,949,158 | B2 * | 9/2005 | Ball et al. | .................... 156/154 |
| 7,284,941 | B2 * | 10/2007 | Yoo | ....................... 414/416.09 |
| 2003/0079828 | A1 * | 5/2003 | Kassir et al. | ................ 156/230 |
| 2003/0134578 | A1 * | 7/2003 | Strasbaugh et al. | ........... 451/41 |
| 2004/0089515 | A1 * | 5/2004 | Yoo | ............................ 198/438 |
| 2005/0062301 | A1 * | 3/2005 | Yoo | ........................... 294/64.1 |
| 2005/0095100 | A1 * | 5/2005 | Yoo | ....................... 414/416.09 |
| 2005/0158968 | A1 * | 7/2005 | Nagai | .......................... 438/464 |
| 2006/0005911 | A1 * | 1/2006 | Kubo et al. | .................... 156/84 |

FOREIGN PATENT DOCUMENTS

| JP | 7-106284 | 4/1995 |
| JP | 10-305420 | 11/1998 |
| WO | WO 2004038779 A1 * | 5/2004 |

\* cited by examiner

*Primary Examiner*—Michelle Estrada
*Assistant Examiner*—Jarrett J Stark
(74) *Attorney, Agent, or Firm*—Smith, Gambrell & Russell, LLP (57) ABSTRACT

A method of processing a wafer having a plurality of streets formed on the front surface in a lattice pattern and a plurality of devices formed in a plurality of areas sectioned by the plurality of streets, comprising an adhesive tape amounting step for mounting the front surface of the outer peripheral portion of an adhesive tape having an adhesive layer on the front surface and a plurality of via holes onto an opening of an annular frame to cover it; a frame fixing step for placing the rear surface of the adhesive tape mounted on the annular frame on the chuck table for suction-holding a workpiece of a processing machine and fixing the annular frame; a wafer affixing step for placing the wafer on the front surface of the wafer affixing area of the adhesive tape, suction-holding the adhesive tape on the suction-holding area of the chuck table by exerting suction-force to the suction-holding area, and sucking the wafer to affix it to the front surface of the adhesive tape; and a processing step for processing the wafer along the streets.

6 Claims, 11 Drawing Sheets

WAFER PROCESSING METHOD AND ADHESIVE TAPE USED IN THE WAFER PROCESSING METHOD

FIELD OF THE INVENTION

The present invention relates to a method of processing a wafer having a plurality of streets formed on the front surface in a lattice pattern and a plurality of devices formed in a plurality of areas sectioned by the plurality of streets, and to an adhesive tape used in the wafer processing method.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC, LSI or the like is formed in each of the sectioned areas. Individual semiconductor chips are manufactured by cutting this semiconductor wafer along the streets to divide it into areas in which the device is formed. An optical device wafer comprising a gallium nitride-based compound semiconductor formed on the front surface of a sapphire substrate is also cut along streets to be divided into individual optical devices such as light emitting diodes or laser diodes which are widely used in electric appliances.

Cutting along the streets of the above semiconductor wafer or optical device wafer is generally carried out by using a cutting machine called "dicer". This cutting machine comprises a chuck table for holding a workpiece such as a semiconductor wafer or an optical device wafer, a cutting means having a cutting blade for cutting the workpiece held on the chuck table, and a processing-feed means for moving the chuck table and the cutting means relative to each other, as disclosed by JP-A 7-106284. The cutting means has a spindle unit comprising a rotary spindle, a cutting blade mounted on the spindle and a drive mechanism for rotary-driving the rotary spindle.

As a means of dividing a wafer such as the above semiconductor wafer or optical device wafer along the streets, a method in which a pulse laser beam is applied along the streets formed on the wafer to form grooves, and the wafer is divided along the grooves is disclosed by JP-A 10-305420.

The wafer divided as described above is supported to an annular frame through an adhesive tape so that the obtained individual chips can be carried to the subsequent step while the form of the wafer is maintained even after the wafer is divided into individual chips.

In order to support the wafer to the annular frame through the adhesive tape, a special tape affixing apparatus for affixing together the wafer, the adhesive tape and the annular frame is required.

Further, the rear surface of the wafer to be divided as described above is ground or etched to a predetermined thickness before it is cut along the streets. Due to recent trends toward the downsizing of electric appliances, it is desired that the thickness of the wafer be reduced to 50 μm or less.

However, when the thickness of the wafer is reduced to 50 μm or less, such a problem arises that the wafer is easily broken and it is difficult to handle the wafer during its conveyance.

SUMMARY OF THE INVENTION

It is a first object of the present invention to provide a wafer processing method that enables to process a wafer in a state where it is affixed to an adhesive tape mounted on an annular frame without using a special tape affixing apparatus.

It is a second object of the present invention to provide a wafer processing method which facilitates the conveyance of a wafer and the handling of the wafer such as affixing it to an annular frame through an adhesive tape and cutting it even when it is made thin; and to provide an adhesive tape used in the wafer processing method.

To attain the above first object, according to the first invention, there is provided a method of processing a wafer having a plurality of streets formed on the front surface in a lattice pattern and a plurality of devices formed in a plurality of areas sectioned by the plurality of streets, comprising:

an adhesive tape mounting step for mounting the front surface of the outer peripheral portion of an adhesive tape having an adhesive layer formed on the front surface and a plurality of via holes, onto an opening of an annular frame to cover it;

a frame fixing step for placing the rear surface of a wafer affixing area of the adhesive tape mounted on the annular frame on the chuck table for suction-holding a workpiece of a processing machine and fixing the annular frame by clamps provided on the chuck table;

a wafer affixing step for placing the wafer on the front surface of the wafer affixing area of the adhesive tape placed on the chuck table, suction-holding the adhesive tape on the suction-holding area of the chuck table by exerting suction-force to the suction-holding area, and sucking the wafer to affix it to the front surface of the adhesive tape; and a processing step for processing the wafer affixed to the front surface of the adhesive tape suction-held on the suction-holding area of the chuck table along the streets by a processing means of the processing machine.

According to the present invention, there is further provided an adhesive tape used in the wafer processing method, which has an adhesive layer on the front surface of a synthetic resin sheet and a plurality of via holes extending through the synthetic resin sheet and the adhesive layer.

To attain the above second object, according to the second invention, there is provided a method of processing a wafer having a plurality of streets formed on the front surface in a lattice pattern, a device area where a plurality of devices are formed in a plurality of areas sectioned by the plurality of streets, and an excess area surrounding the device area, comprising:

a reinforcement forming step for removing an area corresponding to the device area of the rear surface of the wafer to reduce the thickness of the device area to a predetermined value and keeping an area corresponding to the excess area of the rear surface of the wafer as an annular reinforcement;

an adhesive tape mounting step for mounting the front surface of the outer peripheral portion of an adhesive tape having an adhesive layer formed on the front surface and a plurality of via holes onto an opening of an annular frame to cover it;

a frame-fixing step for placing the rear surface of the wafer affixing area of the adhesive tape mounted on the annular frame on the chuck table for suction-holding a workpiece of a processing machine and fixing the annular frame by clamps provided on the chuck table;

a wafer affixing step for placing the rear surface corresponding to the device area of the wafer on the front surface of the wafer affixing area of the adhesive tape placed on the chuck table, suction-holding the adhesive tape onto the suction-holding area of the chuck table by exerting suction-force to the suction-holding area, and sucking the wafer to affix it to the front surface of the adhesive tape;

an excess area removing step for cutting and removing the excess area of the wafer affixed to the front surface of the adhesive tape suction-held on the suction-holding area of the chuck table by the processing means of the processing machine; and a dividing step for cutting the wafer affixed to the front surface of the adhesive tape suction-held on the suction-holding area of the chuck table and devoid of the excess area, along the streets by the processing means of the processing machine.

In the above reinforcement forming step, a circular recess is formed by grinding the area corresponding to the device area of the rear surface of the wafer.

According to the present invention, there is further provided an adhesive tape used in the wafer processing method, which has an adhesive layer on the front surface of a synthetic resin sheet and a plurality of via holes extending through the synthetic resin sheet and the adhesive layer.

According to the above first invention, since the adhesive tape having a plurality of via holes is used, the wafer can be sucked and affixed to the front surface of the adhesive tape through the plurality of via holes by exerting suction-force to the suction-holding area of the chuck table of the processing machine without using a special tape affixing apparatus.

Further, according to the above second invention, even when the thickness of the device area is reduced by removing the area corresponding to the device area of the rear surface of the wafer in the reinforcement forming step, the area corresponding to the excess area of the wafer is kept as the annular reinforcement so as to maintain the stiffness of the wafer. Therefore, the wafer is not broken during its conveyance and its handling becomes easy. Further, according to the present invention, since the adhesive tape having a plurality of via holes is used, the wafer can be sucked through the above plurality of via holes and affixed to the front surface of the adhesive tape by exerting suction-force to the suction-holding area of the chuck table of the processing machine without using a special tape affixing apparatus.

BRIEF DESCRIPTION OF THE DRAWINGS

FIGS. 4(*a*) and 4(*b*) are explanatory diagrams showing an adhesive tape mounting step in the wafer processing method of the present invention;

FIGS. 6(*a*) and 6(*b*) are explanatory diagrams showing a wafer affixing step in the wafer processing method of the present invention;

FIGS. 10(*a*) and 10(*b*) are explanatory diagrams showing a reinforcement forming step in the wafer processing method of the present invention;

FIGS. 11(*a*) and 11(*b*) are explanatory diagrams showing a wafer affixing step in the wafer processing method of the present invention;

FIGS. 13(*a*) and 13(*b*) are explanatory diagrams showing an excess area removing step in the wafer processing method of the present invention.

DETAILED DESCRIPTION OF THE PREFERRED EMBODIMENTS

Preferred embodiments of the wafer processing method of the present invention and the adhesive tape of the present invention used in the wafer processing method will be described in more detail hereinunder with reference to the accompanying drawings.

Figure 1:
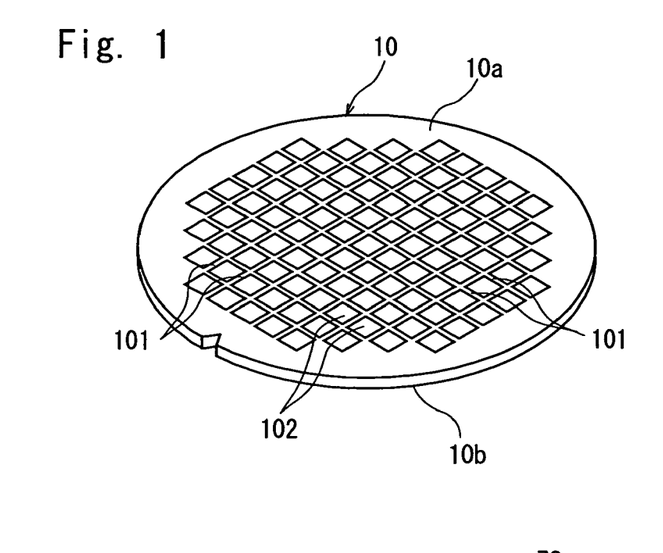
FIG. 1 is a perspective view of a semiconductor wafer to be processed by an embodiment of a wafer processing method of the present invention.

FIG. 1 is a perspective view of a semiconductor wafer as a wafer to be processed by the wafer processing method of the present invention. The semiconductor wafer 10 shown in FIG. 1 is a silicon wafer having a thickness of, for example, 700 μm, a plurality of streets 101 are formed on the front surface 10*a* in a lattice pattern, and devices 102 are formed in a plurality of areas sectioned by the streets 101 arranged in the lattice pattern.

A description will be subsequently given of an embodiment of the wafer processing method for divide-processing the semiconductor wafer 10 along the streets 101.

Here, a cutting machine as a processing machine for processing the semiconductor wafer 10 along the streets 101 will be described with reference to FIG. 2.

Figure 2:
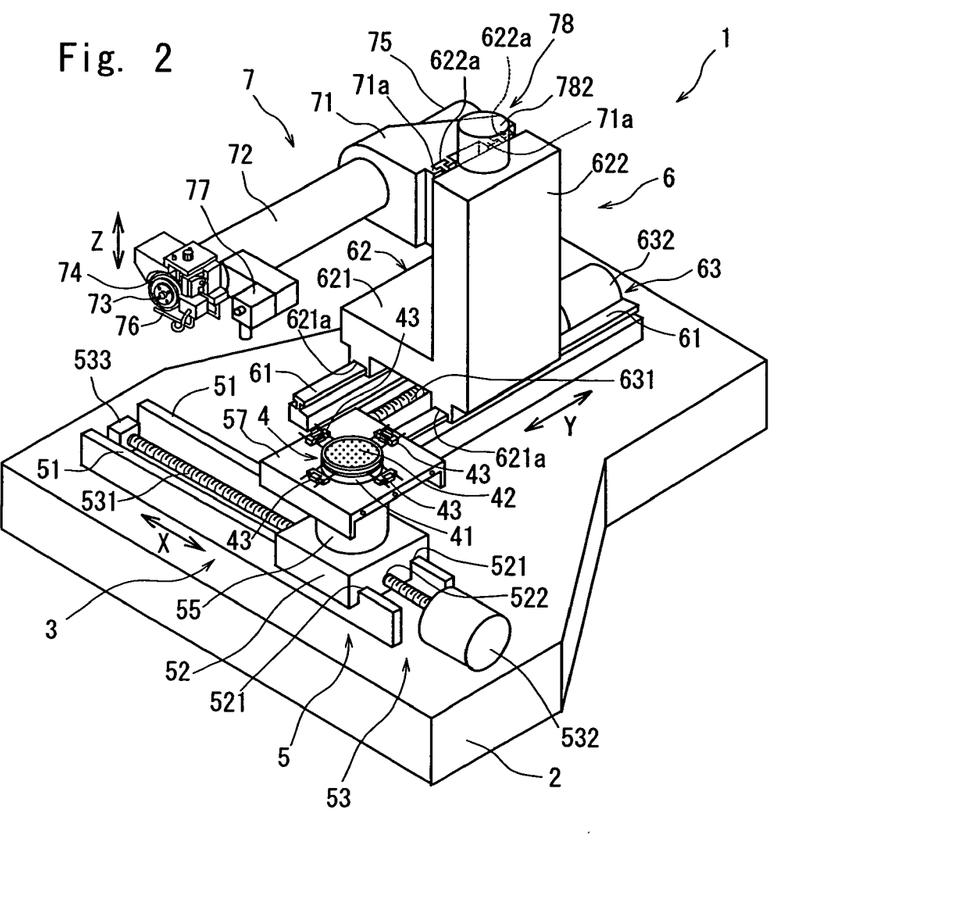
FIG. 2 is a perspective view of a cutting machine for carrying out the wafer processing method of the present invention.

The cutting machine 1 shown in FIG. 2 comprises a stationary base 2, a chuck table mechanism 3 for holding a workpiece, which is mounted on the stationary base 2 in such a manner that it can move in a processing-feed direction indicated by an arrow X, a spindle support mechanism 6 mounted on the stationary base 2 in such a manner that it can move in an indexing-feed direction indicated by an arrow Y (direction perpendicular to the processing-processing-feed direction indicated by the arrow X), and a spindle unit 7 as a cutting means mounted on the spindle support mechanism 6 in such a manner that it can move in a cutting-in feed direction indicated by an arrow Z.

The above chuck table mechanism 3 comprises a chuck table 4 for holding the workpiece and a chuck table moving mechanism 5 for moving the chuck table 4 in the processing-feed direction indicated by the arrow X. The chuck table moving mechanism 5 comprises a pair of guide rails 51 and 51, which are mounted on the stationary base 2 and arranged parallel to each other in the processing-feed direction indicated by the arrow X, a chuck table support base 52 mounted on the guide rails 51 and 51 in such a manner that it can move in the processing-feed direction indicated by the arrow X, and a processing-feed means 53 for moving the chuck table support base 52 along the pair of guide rails 51 and 51.

The above chuck table support base 52 is formed in a rectangular shape, and to-be-guided grooves 521 and 521 to be fitted to the above pair of guide rails 51 and 51 are formed in the under surface of the chuck table support base 52. The above chuck table support base 52 can move along the pair of guide rails 51 and 51 by fitting the to-be-guided grooves 521 and 521 to the pair of guide rails 51 and 51, respectively.

The above processing-feed means 53 comprises a male screw rod 531 arranged between the above pair of guide rails 51 and 51 in parallel thereto and a drive source such as a servo motor 532 for rotary-driving the male screw rod 531. The male screw rod 531 is, at its one end, rotatably supported to a bearing block 533 fixed on the above stationary base 2 and is, at the other end, connected to the output shaft of the above servo motor 532. The male screw rod 531 is screwed into a female screw 522 formed in the center portion of the chuck table support base 52. Therefore, by driving the male screw rod 531 in a normal direction or reverse direction with the servo motor 532, the chuck table support base 52 is moved along the guide rails 51 and 51 in the processing-feed direction indicated by the arrow X.

A description will be subsequently given of the above chuck table 4 with reference to FIG. 2 and FIG. 3.

Figure 3:
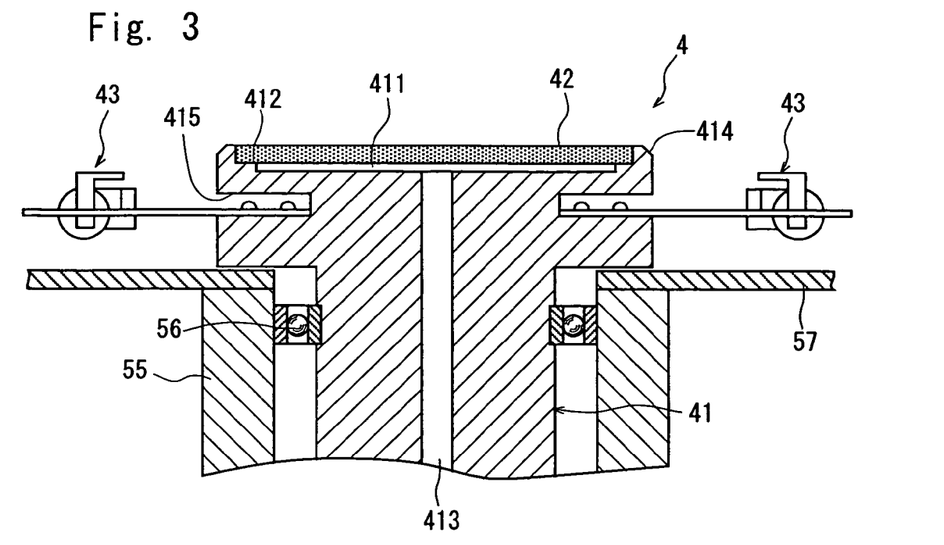
FIG. 3 is a sectional view of the principal portion of a chuck table provided in the cutting machine shown in FIG. 2.

The chuck table 4 shown in FIG. 2 and FIG. 3 is rotatably supported in a support cylinder 55 installed on the top surface of the chuck table support base 52 through a bearing 56, as shown in FIG. 3. The chuck table 4 consists of a columnar body portion 41 and an adsorption chuck 42 composed of a porous member such as a porous ceramic member mounted on the top surface of the body portion 41, as shown in FIG. 3. The body portion 41 is made of a metal material such as stainless steel, and a circular fitting recess portion 411 is formed in the top surface. An annular placing shelf 412 for placing the adsorption chuck 42 is formed in the peripheral portion of the bottom surface of this fitting recess portion 411. A suction passage 413 open to the fitting recess portion 411 is formed in the body portion 41 and connected to a suction means that is not shown. Therefore, when the suction means (not shown) is activated, negative pressure acts on the fitting recess portion 411 through the suction passage 413. The thus constituted chuck table 4 is suitably turned by a rotary drive means. The upper end of the body portion 41 of the chuck table 4 has a chambered periphery 414.

An annular groove 415 is formed in the upper part of the body portion 41 constituting the above chuck table 4. The base portions of four clamps 43 (see FIG. 2) are arranged in this annular groove 415 and fixed to the body portion 41 by a suitable fixing means. A support table 57 is mounted on the upper end of the support cylinder 55.

Continuing the description with reference to FIG. 2, the above spindle support mechanism 6 has a pair of guide rails 61 and 61, which are mounted on the stationary base 2 and arranged parallel to each other in the indexing-feed direction indicated by the arrow Y, and a movable support base 62 mounted on the guide rails 61 and 61 in such a manner that it can move in the direction indicated by the arrow Y. This movable support base 62 consists of a movable support portion 621 movably mounted on the guide rails 61 and 61 and a mounting portion 622 mounted on the movable support portion 621. A pair of to-be-guided grooves 621a and 621a to be fitted to the pair of guide rails 61 and 61 are formed in the under surface of the movable support portion 621, and the movable support base 62 can move along the guide rails 61 and 61 by fitting the guide grooves 621a and 621a to the guide rails 61 and 61, respectively. The mounting portion 622 is provided with a pair of guide rails 622a and 622a extending in parallel in the direction indicated by the arrow Z on one of its flanks.

The spindle support mechanism 6 in the illustrated embodiment comprises an indexing-feed means 63 for moving the movable support base 62 along the pair of guide rails 61 and 61 in the indexing-feed direction indicated by the arrow Y. This indexing-feed means 63 comprises a male screw rod 631 arranged between the above pair of guide rails 61 and 61 in parallel thereto and a drive source such as a pulse motor 632 for rotary-driving the male screw rod 631. The male screw rod 631 is, at its one end, rotatably supported to a bearing block (not shown) fixed on the above stationary base 2 and is, at the other end, connected to the output shaft of the above pulse motor 632. The male screw rod 631 is screwed into a threaded through-hole formed in a female screw block (not shown) projecting from the under surface of the center portion of the movable support portion 621 constituting the movable support base 62. Therefore, by driving the male screw rod 631 in a normal direction or reverse direction with the pulse motor 632, the movable support base 62 is moved along the guide rails 61 and 61 in the indexing-feed direction indicated by the arrow Y.

The spindle unit 7 in the illustrated embodiment has a unit holder 71, a spindle housing 72 secured to the unit holder 71 and a rotary spindle 73 rotatably supported to the spindle housing 72. The unit holder 71 has a pair of to-be-guided grooves 71a and 71a to be slidably fitted to the pair of guide rails 622a and 622a on the above mounting portion 622 and is supported in such a manner that it can move in the cutting-in feed direction indicated by the arrow Z by fitting the to-be-guided grooves 71a and 71a to the above guide rails 622a and 622a, respectively. The above rotary spindle 73 projects from the end of the spindle housing 72, and a cutting blade 74 is attached to the end of the rotary spindle 73. The rotary spindle 73 having the cutting blade 74 is rotary-driven by a drive source such as a servo motor 75. A cutting water supply nozzle 76 for supplying cutting water to a cutting portion by the cutting blade 74 is provided on both sides of the cutting blade 74. An image pick-up means 77 for picking up an image of the workpiece held on the above chuck table 4 to detect the area to be cut by the above cutting blade 74 is mounted on the end portion of the above spindle housing 72. This image pick-up means 77 is composed of an optical means such as a microscope or CCD camera, and an image signal is supplied to a control means.

The spindle unit 7 in the illustrated embodiment comprises a cutting-in feed means 78 for moving the unit holder 71 along the pair of guide rails 622a and 622a in the direction indicated by the arrow Z. The cutting-in feed means 78 comprises a male screw rod (not shown) arranged between the guide rails 622a and 622a and a drive source such as a pulse motor 782 for rotary-driving the male screw rod, like the above processing-feed means 53 and the indexing-feed means 63. By driving the male screw rod (not shown) in a normal direction or reverse direction with the pulse motor 782, the unit holder 71, the spindle housing 72 and the rotary spindle 73 are moved along the guide rails 622a and 622a in the cutting-in feed direction indicated by the arrow Z.

The cutting machine 1 in the illustrated embodiment is constituted as described above and the method of cutting the above semiconductor wafer 10 along the streets 101 with the cutting machine 1 will be described hereinunder.

First comes an adhesive tape mounting step for mounting the front surface of the outer peripheral portion of an adhesive tape having a plurality of via holes and an adhesive layer formed on the front surface onto an annular frame opening to cover it. That is, as shown in FIG. 4(a), the front surface of the outer peripheral portion 110 of the adhesive tape 11 is mounted onto the annular frame 12 to cover its opening. The adhesive tape 11 has an adhesive layer 112 formed on the front surface 111a of a synthetic resin sheet 111 such as a polyolefin or vinyl chloride sheet and a plurality of via holes 113 which are formed by laser processing and extend through the synthetic resin sheet 111 and the adhesive layer 112, as shown in FIG. 4(b).

Next comes a frame fixing step for placing the rear surface of the wafer affixing area of the adhesive tape 11 mounted on the annular frame 12 onto the chuck table, as shown in FIG. 4(a), and fixing the annular frame 12 by clamps provided on the chuck table. That is, as shown in FIG. 5, the rear surface 115b of the wafer affixing area 115 of the adhesive tape 11 mounted on the annular frame 12 is placed on the adsorption chuck 42 of the chuck table 4, and the annular frame 12 is fixed by the clamps 43.

Figure 6:
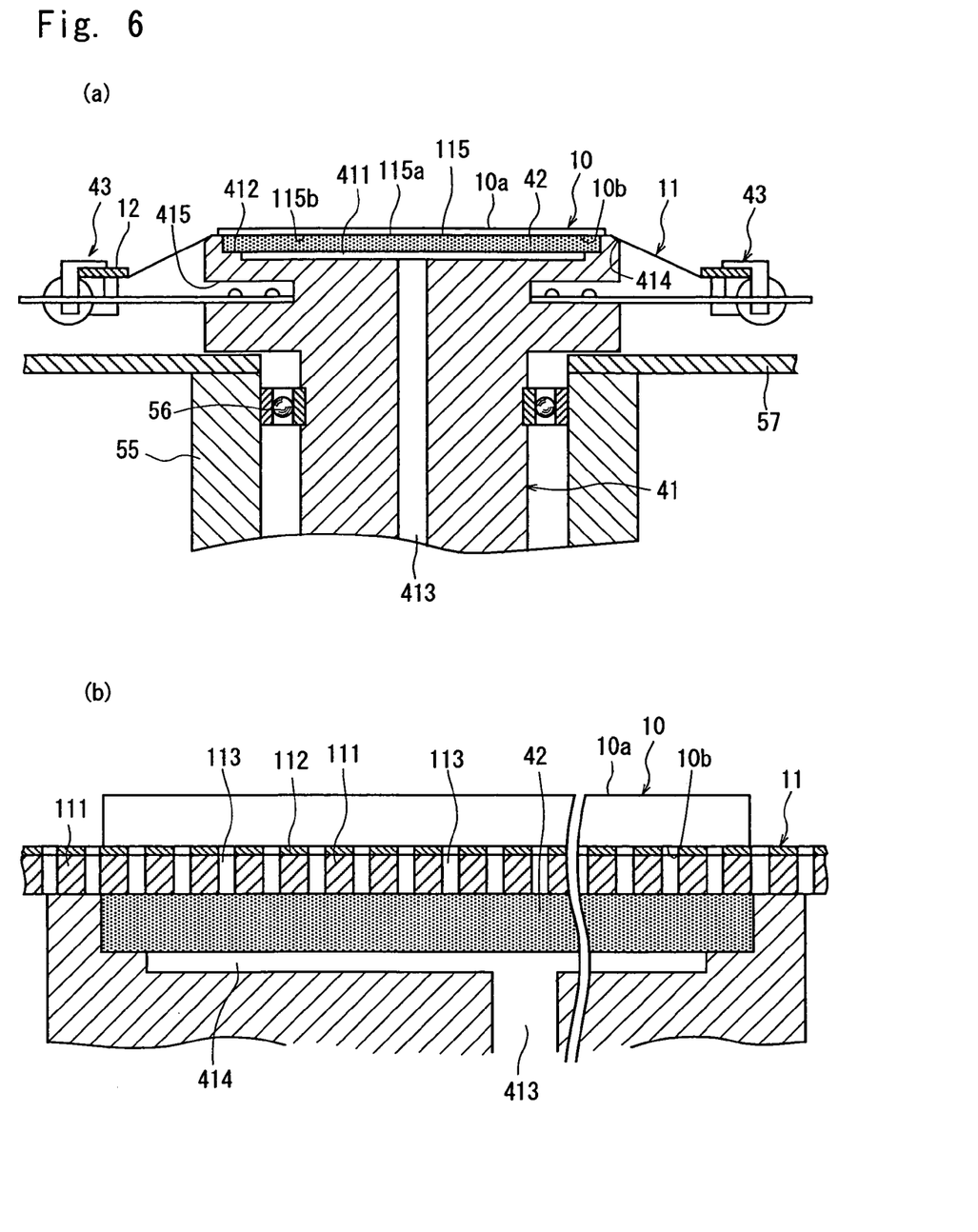

The above frame fixing step is followed by a wafer affixing step for placing the wafer 10 on the front surface 115a of the wafer affixing area 115 of the adhesive tape 11 placed on the chuck table 4 and exerting suction-force to the suction-holding area of the chuck table 4 to suction-hold the adhesive tape 11 onto the suction-holding area and to suck the wafer 10 to affix it to the front surface 115a of the wafer affixing area 115 of the adhesive tape 11, as shown in FIG. 6(a). That is, the rear surface 10b of the semiconductor wafer 10 is placed on the front surface 115a of the wafer affixing area 115 of the adhesive tape 11 placed on the adsorption chuck 42 which is the suction-holding area of the chuck table 4. Therefore, the front surface 10a of the semiconductor wafer 10 faces up. When the suction means (not shown) is activated, negative pressure acts on the fitting recess portion 411 through the suction passage 413. As a result, suction-force acts on the top surface (suction-holding area) of the adsorption chuck 42 composed of a porous member to suction-hold the adhesive tape 11 on the suction-holding area, and negative pressure acts on the rear surface 10b of the semiconductor wafer 10 through the plurality of via holes 113 formed in the adhesive tape 11, as shown in FIG. 6(b), whereby the semiconductor wafer 10 is sucked and affixed to the adhesive layer 112 of the adhesive tape 11. By thus using this adhesive tape 11, the semiconductor wafer 10 can be sucked and affixed to the front surface of the porous adhesive tape 11 without using a special tape affixing apparatus.

After the above wafer affixing step, the processing-feed means 53 is activated to move the chuck table 4 to a position right below the image pick-up means 77. After the chuck table 4 is positioned right below the image pick-up means 77, the image pick-up means 77 and the control means (not shown) carry out alignment work for detecting the to-be-cut area of the semiconductor wafer 10. That is, the image pick-up means 77 and the control means (not shown) carry out image processing such as pattern matching, etc. to align a street 101 formed in a predetermined direction of the semiconductor wafer 10 with the cutting blade 74 for cutting it along the street 101, thereby performing the alignment of the area to be cut. The alignment of the area to be cut is also carried out on streets 101 formed on the semiconductor wafer 10 in a direction perpendicular to the above predetermined direction.

Figure 7:
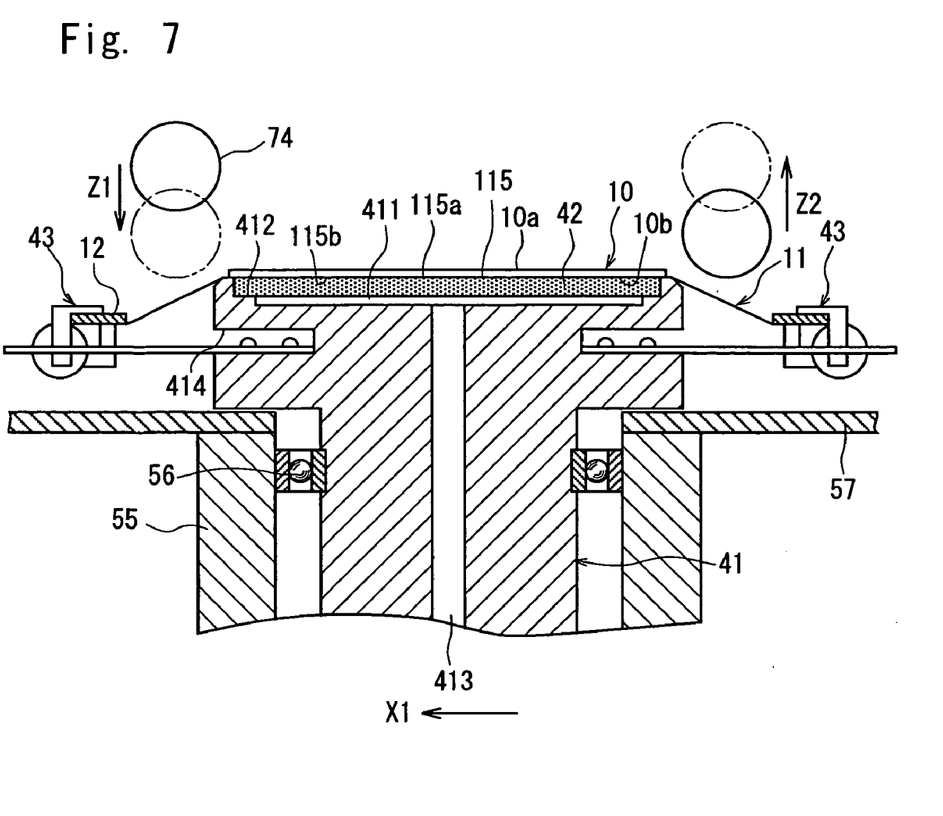
FIG. 7 is an explanatory diagram showing a processing step in the wafer processing method of the present invention.

After the alignment work for detecting the to-be-cut area of the semiconductor wafer 10, next comes a processing step for processing the semiconductor wafer 10 affixed to the adhesive layer 112 of the adhesive tape 11 suction-held on the suction-holding area of the chuck table 4, along the streets 101. That is, the chuck table 4 is moved to a cutting area, and one end of the predetermined street 101 is brought to a position slightly on the right side of a position right below the cutting blade 74 as shown in FIG. 7. Then, the cutting blade 74 is moved down (cutting-in fed) a predetermined distance in the direction indicated by the arrow Z1 while it is rotated, and the above processing-feed means 53 is activated to move the chuck table 4 in the direction indicated by the arrow X1 in FIG. 7 at a predetermined cutting-feed rate. The amount of feed for cutting-in is set to a position reaching the rear surface 10b (undersurface) of the semiconductor wafer 10. When the other end of the predetermined street 101 of the semiconductor wafer 10 held on the chuck table 4 reaches a position slightly on the left side of a position right below the cutting blade 74 as shown in FIG. 7, the movement of the chuck table 4 is stopped and the cutting blade 74 is moved up in the direction indicated by the arrow Z2. As a result, the semiconductor wafer 10 is cut along the predetermined street 101.

After the above-described processing step is carried out along all the streets 101 formed on the semiconductor wafer 10 in the predetermined direction, the chuck table 4 is turned at 90°. The above processing step is then carried out along all the streets 101 formed on the semiconductor wafer 10 in a direction perpendicular to the above predetermined direction. As a result, the semiconductor wafer 10 is cut along all the streets 101. The semiconductor wafer 10 is divided into semiconductor chips having the respective devices by being cut along all the streets 101 as described above. Since the obtained individually semiconductor chips are affixed to the porous adhesive tape 11 mounted on the annular frame 12, they do not fall apart and the form of the wafer is maintained. The individual semiconductor chips are carried to the subsequent step in a state where they are affixed to the porous adhesive tape 11 mounted on the annular frame 12.

A description will be subsequently given of another embodiment of the wafer processing method of the present invention with reference to FIGS. 8 to 14.

Figure 8:
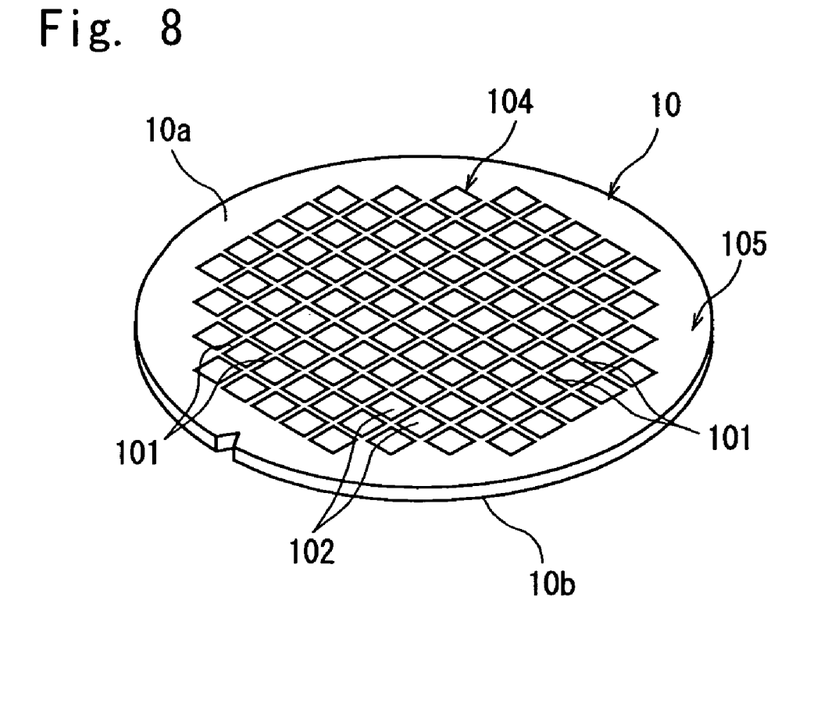
FIG. 8 is a perspective view of a semiconductor wafer to be processed by another embodiment of the wafer processing method of the present invention.

FIG. 8 is a perspective view of a semiconductor wafer as a wafer to be processed by another embodiment of the wafer processing method of the present invention. The semiconductor wafer 10 shown in FIG. 8 is a silicon wafer having a thickness of, for example, 700 μm, a plurality of streets 101 are formed on the front surface 10a in a lattice pattern, and a device 102 such as IC or LSI is formed in a plurality of areas sectioned by the plurality of streets 101, like the above semiconductor wafer 10 shown in FIG. 1. The thus constituted semiconductor wafer 10 has a device area 104 where the devices 102 are formed and an excess area 105 surrounding the device area 104.

Figure 9:
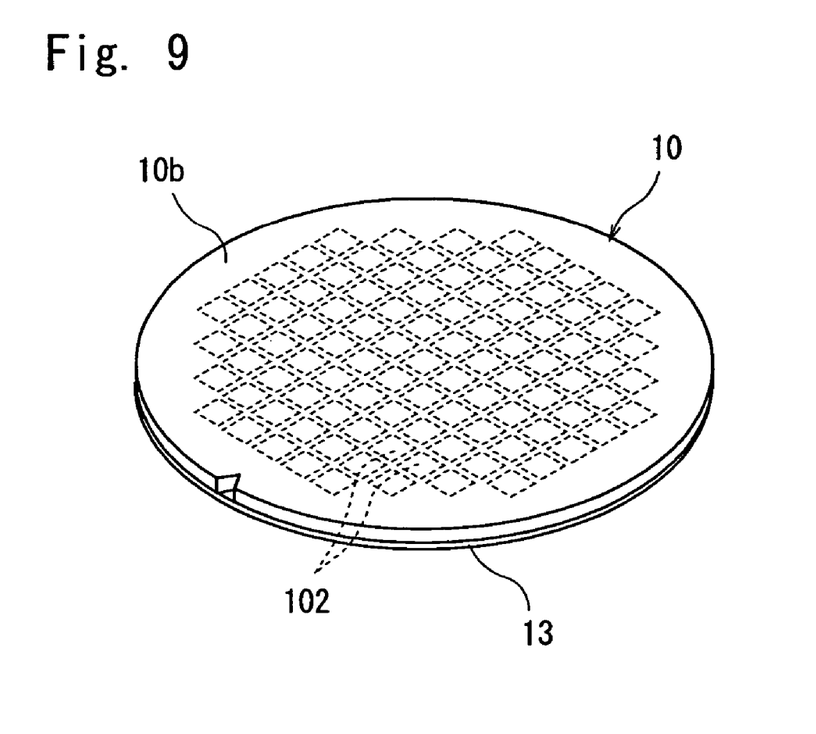
FIG. 9 is a perspective view of the semiconductor wafer shown in FIG. 8 to which a protective member is affixed.
Figure 10:
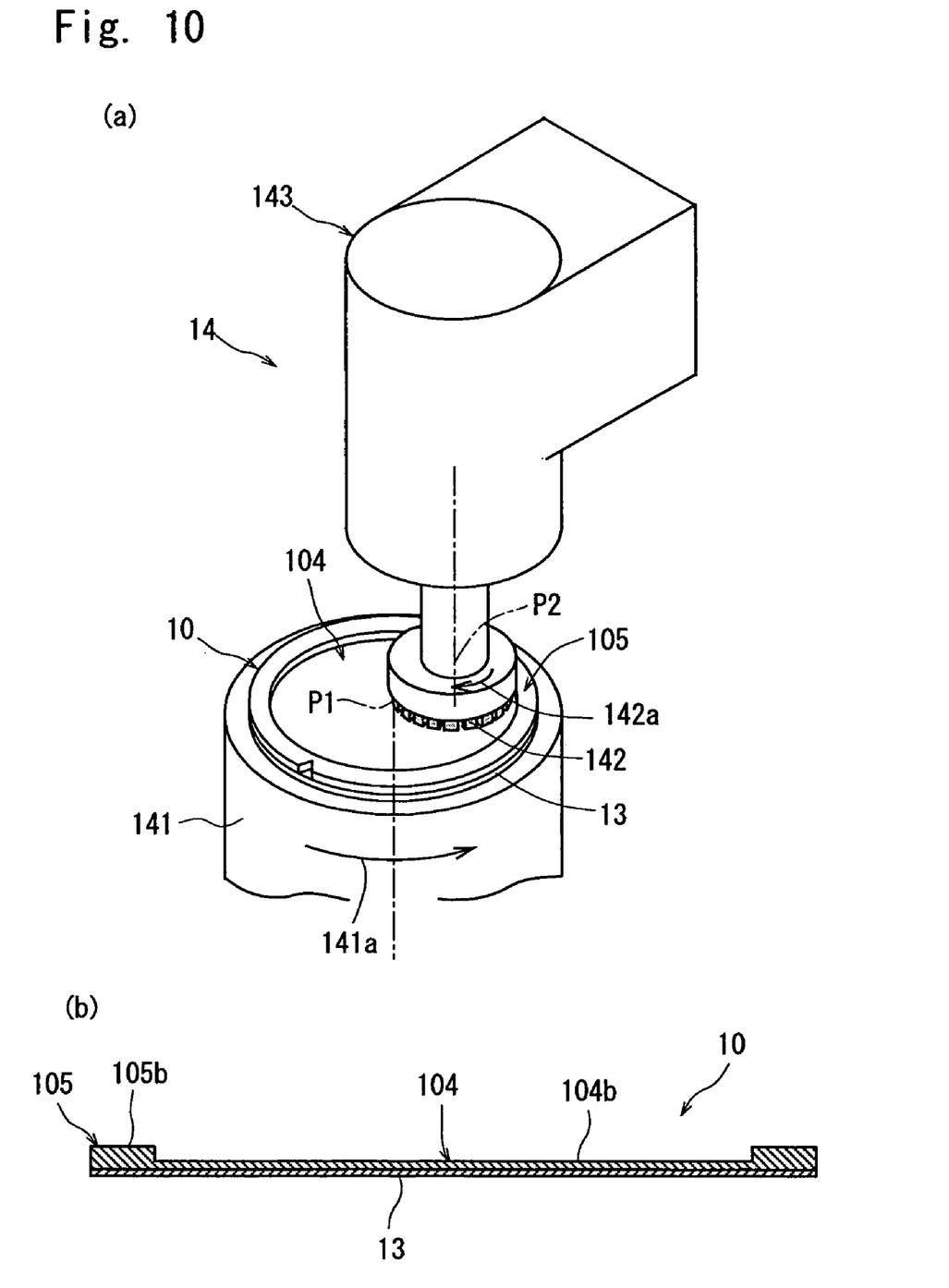
Figure 11:
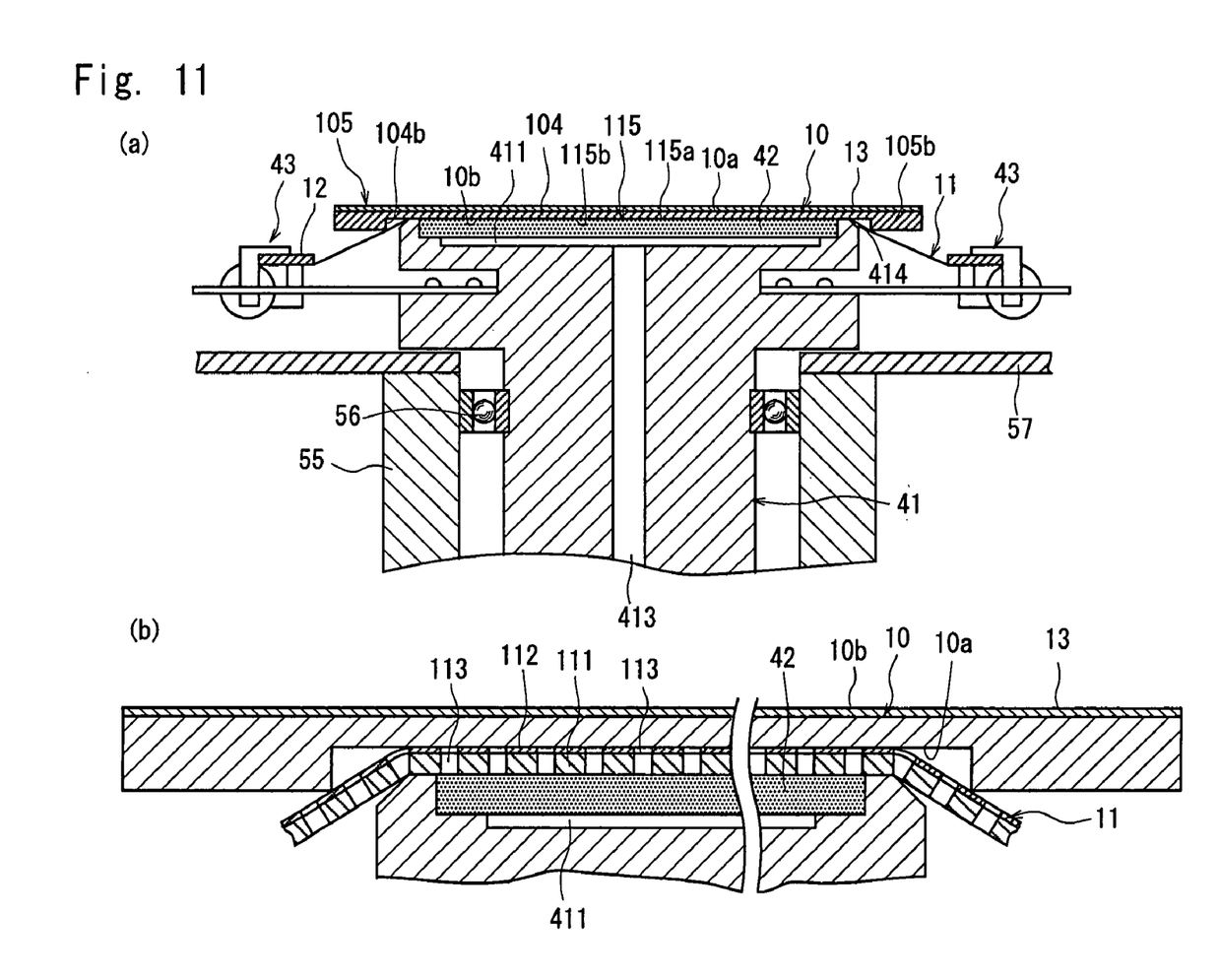

A protective member 13 is affixed to the front surface 10a of the thus constituted semiconductor wafer 10 as shown in FIG. 9 (protective member affixing step). Therefore, the rear surface 10b of the semiconductor wafer 10 is exposed.

The protective member affixing step is followed by a reinforcement forming step for forming an annular reinforcement by removing an area corresponding to the device area 104 of the rear surface 10b of the semiconductor wafer 10 to reduce the thickness of the device area 104 to a predetermined value and keeping an area corresponding to the extra area 105 of the rear surface 10b of the semiconductor wafer 10. This reinforcement forming step is carried out by using a grinding machine 14 shown in FIG. 10(a) in the illustrated embodiment. The grinding machine 14 shown in FIG. 10(a) comprises a chuck table 141 for holding a workpiece and s grinding means 143 having a grindstone 142 for grinding the workpiece held on the chuck table 141. To carry out the reinforcement forming step by using this grinding machine 14, the protective member 13 of the semiconductor wafer 10 is first placed on the chuck table 141 to suction-hold the semiconductor wafer 10 on the chuck table 141. The relationship between the semiconductor wafer 10 held on the chuck table 141 and the grindstone 142 will be explained herein below. The center P1 of rotation of the chuck table 141 and the center P2 of rotation of the grindstone 142 are eccentric to each other, and the diameter of the grindstone 142 is set in such a size that the grindstone 142 is always located on the inner side of the extra area 105 of the semiconductor wafer 10 and passes over the center P1 (the center of the semiconductor wafer 10) of rotation of the chuck table 141. After the semiconductor wafer 10 is suction-held on the chuck table 141, the grindstone 142 of the grinding means 143 is rotated at 6,000 rpm in the direction indicated by an arrow 142a to be brought into contact with the rear surface 10b of the semiconductor wafer 10 while the chuck table 141 is rotated at 300 rpm in the direction indicated by an arrow 141a. The grinding means 143 is moved down (grinding-fed) a predetermined distance at a predetermined grinding-feed rate. As a result, the area corresponding to the device area 104 is ground and removed as shown in FIG. 10(b) to form a circular recess 104b having a predetermined thickness (for example, 30 µm) in the rear surface 10b of the semiconductor wafer 10 and the area corresponding to the extra area 105 is kept to be formed as an annular reinforcement 105b. The circular recess 104b has an inner diameter larger than the diameter of the chuck table of the cutting machine which will be described later.

Even though the thickness of the device area 104 is thus reduced by removing the area corresponding to the device area 104 of the rear surface of the semiconductor wafer 10 in the reinforcement forming step, the area corresponding to the excess area 105 of the semiconductor wafer 10 is allowed to be kept as the annular reinforcement 105b to maintain the stiffness of the semiconductor wafer 10. Therefore, the semiconductor wafer 10 is not broken during its conveyance and its handling becomes easy.

A description will be subsequently given of the processing method for cutting the semiconductor wafer 10 along the streets 101 by using the cutting machine 1 shown in FIG. 2 and FIG. 3.

Figure 4:
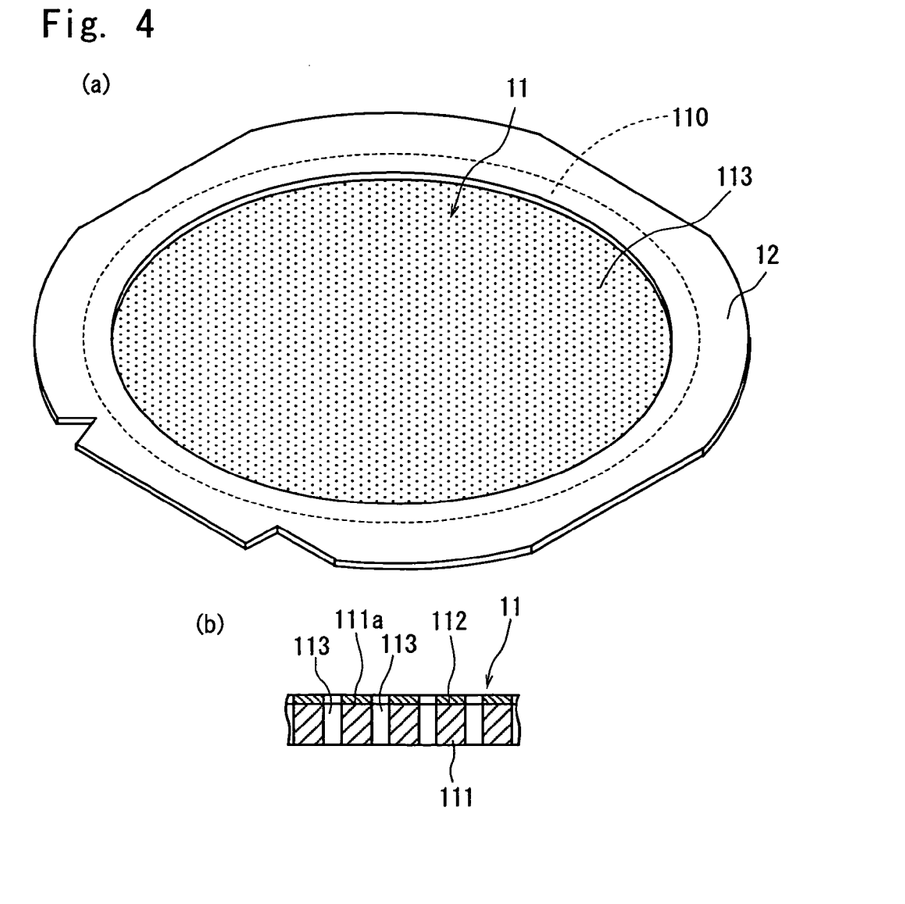
Figure 5:
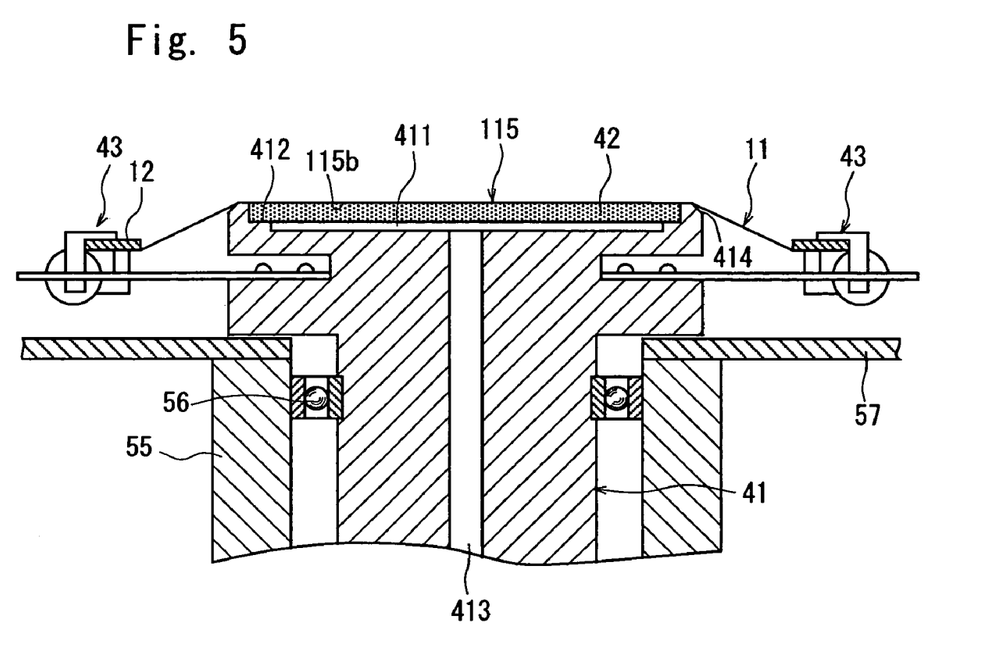
FIG. 5 is an explanatory diagram showing a frame fixing step in the wafer processing method of the present invention.

First comes an adhesive tape mounting step for mounting the adhesive tape having an adhesive layer on the front surface and a plurality of via holes onto the annular frame to cover its opening, as shown in FIG. 4.

Next comes a frame fixing step for placing the rear surface 115b of the wafer affixing area 115 of the adhesive tape 11 mounted on the annular frame 12 on the adsorption chuck 42 of the chuck table 4 as shown in FIG. 5 and fixing the annular frame 12 by the clamps 43.

The above frame fixing step is followed by a wafer affixing step for placing the rear surface corresponding to the device area 104 of the semiconductor wafer 10 on the front surface 115a of the wafer affixing area 115 of the adhesive tape 11 placed on the chuck table 4, suction-holding the adhesive tape 11 on the suction-holding area by exerting suction-force to the suction-holding area of the chuck table 4 and sucking the semiconductor wafer 10 to affix it to the front surface of the adhesive tape 11. That is, the rear surface corresponding to the device area 104 of the semiconductor wafer 10 is placed on the front surface 115a of the wafer affixing area 115 of the adhesive tape 11 placed on the adsorption chuck 42 which is the suction-holding area of the chuck table 4. Therefore, the front surface 10a of the semiconductor wafer 10 faces up. Since the inner diameter of the circular recess 104b formed by grinding the area corresponding to the device area 104 in the rear surface 10b of the semiconductor wafer 10 is larger than the outer diameter of the chuck table 4, the annular reinforcement 105b corresponding to the excess area 105 is not placed on the adhesive tape 11. Further, as the upper end of the body portion 41 of the chuck table 4 has a chambered periphery 414, the adhesive tape 11 is not held between the periphery of the upper end of the body portion 41 of the chuck table 4 and the annular reinforcement 105b of the semiconductor wafer 10. When the suction means (not shown) is activated, negative pressure is caused to act on the fitting recess portion 411 through the suction passage 413 with the result that suction-force acts on the top surface (suction-holding area) of the adsorption chuck 42 composed of a porous member to suction-hold the adhesive tape 11 on the suction-holding area and negative pressure acts on the rear surface 10b of the semiconductor wafer 10 through the plurality of via holes 113 formed in the adhesive tape 11 as shown in FIG. 11(b), whereby the semiconductor wafer 10 is sucked and affixed to the adhesive layer 112 of the adhesive tape 11. Thus, the semiconductor wafer 10 can be sucked and affixed to the front surface of the adhesive tape 11 by using the adhesive tape 11 without using a special tape affixing apparatus.

Figure 12:
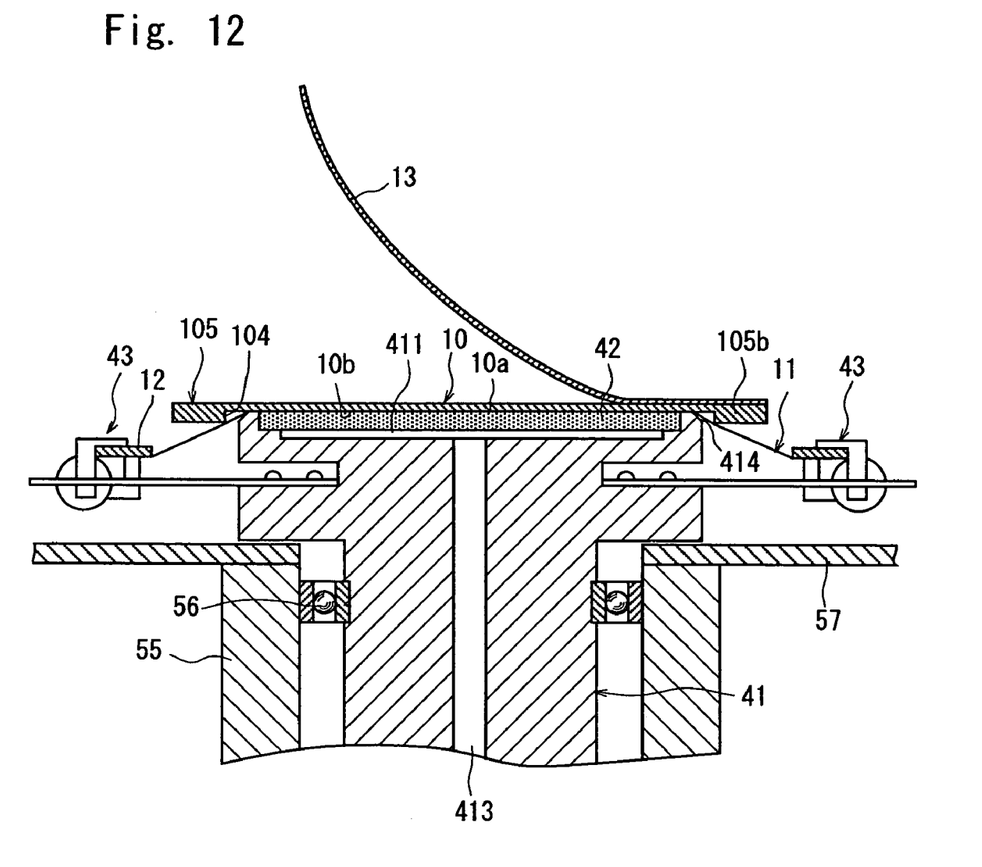
FIG. 12 is an explanatory diagram showing a protective member removing step in the wafer processing method of the present invention.
Figure 13:
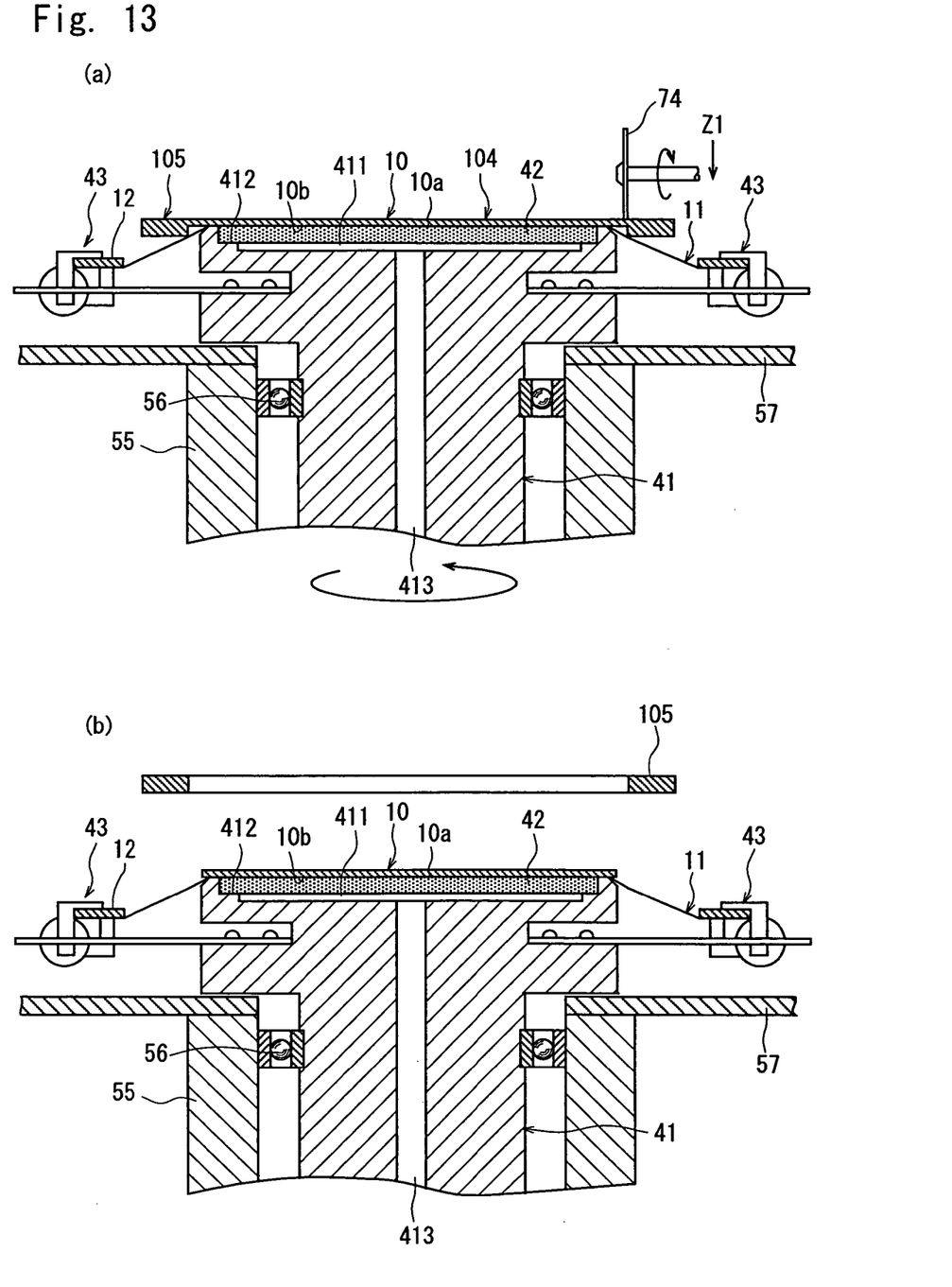

After the above wafer affixing step, the protective member 13 affixed to the front surface 10a of the semiconductor wafer 10 is removed as shown in FIG. 12 (protective member removing step).

After the above wafer affixing step and the protective member removing step, next comes an excess area removing step for cutting and removing the excess area 105 of the semiconductor wafer 10 affixed to the front surface of the adhesive tape 11 suction-held on the suction-holding area of the chuck table 4. That is, the boundary portion between the device area 104 and the excess area 105 of the semiconductor wafer 10 held on the chuck table 4 is brought to a position right below the cutting blade 74 by activating the processing-feed means 53, as shown in FIG. 13(a). The chuck table 4 is rotated in the direction indicated by the arrow and the cutting blade 74 is moved down (cutting-fed) in the direction indicated by the arrow Z1 while it is turned. As a result, as shown in FIG. 13(b), the semiconductor wafer 10 is cut at the boundary portion between the device area 104 and the excess area 105 to remove the excess area 105.

After the excess area removing step, the chuck table 4 is moved to a position right below the image pick-up means 77 by activating the processing-feed means 53. After the chuck table 4 is positioned right below the image pick-up means 77, the image pick-up means 77 and the control means (not shown) carry out alignment work for detecting the to-be-cut area of the semiconductor wafer 10. That is, the image pick-up means 77 and the control means (not shown) carry out image processing such as pattern matching, etc. to align a street 101 formed in a predetermined direction of the semiconductor wafer 10 with the cutting blade 74 for cutting along the street 101, thereby performing the alignment of the area to be cut. The alignment of the area to be cut is also carried out on streets 101 formed on the semiconductor wafer 10 in a direction perpendicular to the above predetermined direction.

Figure 14:
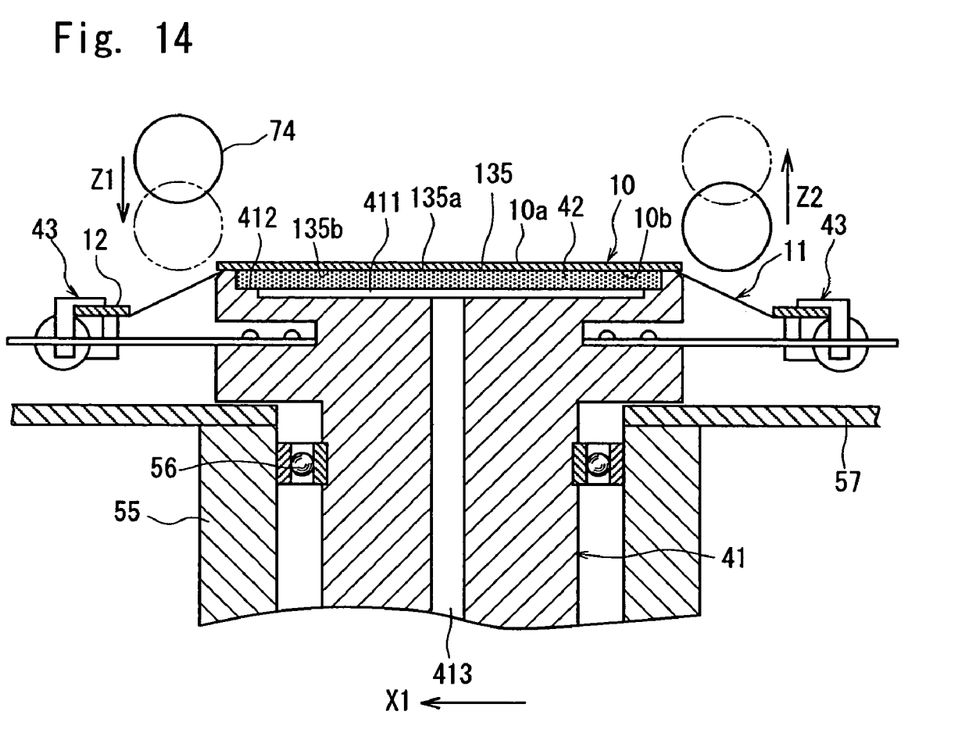
FIG. 14 is an explanatory diagram showing a dividing step in the wafer processing method of the present invention.

After the alignment work for detecting the to-be-cut area of the semiconductor wafer 10, next comes a dividing step for cutting the semiconductor wafer 10 affixed to the adhesive layer 112 of the adhesive tape 11 suction-held on the suction-holding area of the chuck table 4, along the streets 101. That is, the chuck table 4 is moved to a cutting area to bring one end of the predetermined street 101 to a position slightly on the right side of a position right below the cutting blade 74, as shown in FIG. 14. The cutting blade 74 is moved down (cutting-in fed) a predetermined distance in the direction indicated by the arrow Z1 while it is rotated, and the above processing-feed means 53 is activated to move the chuck table 4 in the direction indicated by the arrow X1 in FIG. 14 at a predetermined cutting-feed rate. The amount of feed for cutting-in is set to a position reaching the rear surface 10b (undersurface) of the semiconductor wafer 10. When the other end of the predetermined street 101 of the semiconductor wafer 10 held on the chuck table 4 reaches a position slightly on the left side of a position right below the cutting blade 74 as shown in FIG. 14, the movement of the chuck table 4 is stopped and the cutting blade 74 is moved up in the direction indicated by the arrow Z2. As a result, the semiconductor wafer 10 is cut along the predetermined street 101.

After the above dividing step is carried out along all the streets 101 formed on the semiconductor wafer 10 in the predetermined direction, the chuck table 4 is turned at 90°. The above dividing step is then carried out along all the streets 101 formed on the semiconductor wafer 10 in a direction perpendicular to the above predetermined direction. As a result, the semiconductor wafer 10 is cut along all the streets 101. Therefore, the semiconductor wafer 10 is divided into semiconductor chips having the respective devices by cutting along all the streets 101. Since thus obtained individually divided semiconductor chips are affixed to the adhesive tape 11 mounted on the annular frame 12, they do not fall apart and the form of the wafer is maintained. The individual semiconductor chips are conveyed to the subsequent step in a state where they are affixed to the porous adhesive tape 11 affixed to the annular frame 12.

While the present invention has been described based on embodiments shown in the accompanying drawings, it is to be understood that the present invention is not limited thereto and various changes and modifications may be made in the present invention without departing from the spirit and scope thereof. For example, in the above embodiments, the semiconductor wafer 10 is cut along the streets 101 formed on the semiconductor wafer 10. The present invention can be also applied to a laser processing method for applying a laser beam along the streets 101 formed on the semiconductor wafer 10.

In the above embodiments, the excess area removing step and the dividing step are carried out by cutting. The excess area removing step and the dividing step may be carried out by laser processing.

What is claimed is:

1. A method of processing a wafer having a plurality of streets formed on the front surface in a lattice pattern, a device area where a plurality of devices are formed in a plurality of areas sectioned by the plurality of streets, and an excess area surrounding the device area, comprising:

a reinforcement forming step for removing an area corresponding to the device area of the rear surface of the wafer to reduce the thickness of the device area to a predetermined value and for keeping an area corresponding to the excess area of the rear surface of the wafer to form an annular reinforcement that is part of the wafer;

an adhesive tape mounting step for mounting the front surface of an outer peripheral portion of an adhesive tape onto an opening of an annular frame to cover it, the adhesive tape having an adhesive layer and a plurality of via-holes formed in the adhesive layer;

a frame-fixing step for placing the rear surface of a wafer affixing area of the adhesive tape mounted on the annular frame on a chuck table for suction-holding a workpiece of a processing machine and fixing the annular frame by clamps provided on the chuck table;

a wafer affixing step for placing the rear surface corresponding to the device area of the wafer on the front surface of the wafer affixing area of the adhesive tape placed on the chuck table, suction-holding the adhesive tape onto a suction-holding area of the chuck table by exerting suction-force to the suction-holding area, and at the same time sucking the wafer through the via-holes by exerting suction-force of the suction-holding area through the via-holes to affix the wafer to the front surface of the adhesive tape;

an excess area removing step for cutting and removing the excess area of the wafer affixed to the front surface of the adhesive tape suction-held on the suction-holding area of the chuck table by the processing means of the processing machine; and a dividing step for cutting the wafer, which has been affixed to the front surface of the adhesive tape suction-held on the suction-holding area of the chuck table and is devoid of the excess area, along the streets by the processing means of the processing machine.

2. The wafer processing method according to claim 1, wherein a circular recess is formed by grinding an area corresponding to the device area of the rear surface of the wafer in the reinforcement forming step.

3. The wafer processing method according to claim 2, wherein the circular recess has an inner diameter larger than the outside diameter of the chuck table.

4. The wafer processing method according to claim 2, wherein the annular reinforcement is not placed on the adhesive tape when the wafer is placed on the chuck table in the wafer affixing step.

5. The wafer processing method according to claim 3, wherein the upper end of the body portion of the chuck table is chamfered.

6. The wafer processing method according to claim 2, further comprising a protective member affixing step for affixing a protective member to the front surface of the wafer prior to the reinforcement forming step and a protective member removing step for removing the protective member affixed to the front surface of the wafer between the wafer affixing step and the excess area removing step.

* * * * *